US010964661B2

(12) United States Patent
Abe et al.

(10) Patent No.: US 10,964,661 B2
(45) Date of Patent: Mar. 30, 2021

(54) WIRE BONDING APPARATUS, CIRCUIT FOR WIRE BONDING APPARATUS, AND METHOD FOR MANUFACTURING SEMICONDUCTOR DEVICE (71) Applicant: SHINKAWA LTD., Tokyo (JP)

(72) Inventors: Junichi Abe, Tokyo (JP); Hisashi Ueda, Tokyo (JP); Yutaka Kondo, Tokyo (JP)

(73) Assignee: SHINKAWA LTD., Tokyo (JP)

(*) Notice: Subject to any disclaimer, the term of this patent is extended or adjusted under 35 U.S.C. 154(b) by 343 days.

(21) Appl. No.: 16/088,081

(22) PCT Filed: Mar. 24, 2017

(86) PCT No.: PCT/JP2017/012080
§ 371 (c)(1),
(2) Date: Jan. 14, 2019

(87) PCT Pub. No.: WO2017/164386
PCT Pub. Date: Sep. 28, 2017

(65) Prior Publication Data
US 2020/0294957 A1    Sep. 17, 2020

(30) Foreign Application Priority Data
Mar. 25, 2016    (JP) .............................. JP2016-061147

(51) Int. Cl.
H01L 23/00    (2006.01)

(52) U.S. Cl.
CPC .............. H01L 24/78 (2013.01); H01L 24/85 (2013.01); H01L 2224/782 (2013.01); H01L 2224/78271 (2013.01); H01L 2224/85045 (2013.01)

(58) Field of Classification Search
CPC ......... H01L 24/78; H01L 24/85; H01L 24/84; H01L 2224/782; H01L 2224/78271;
(Continued)

(56) References Cited

U.S. PATENT DOCUMENTS 5,468,927 A    11/1995  Terakado
2006/0186839 A1*  8/2006  Miyahara ............... H01L 24/85
                                                318/34
2007/0187470 A1*  8/2007  Tei ......................... H01L 24/49
                                                228/180.5

FOREIGN PATENT DOCUMENTS

JP    H0794545    4/1995
JP    H11243119   9/1999
(Continued)

OTHER PUBLICATIONS

"International Search Report (Form PCT/ISA/210)", dated Jun. 13, 2017, with English translation thereof, pp. 1-2.

Primary Examiner — Allen L Parker
Assistant Examiner — Wasiul Haider
(74) Attorney, Agent, or Firm — JCIPRNET (57) ABSTRACT The present invention comprises: a spool (10); a clamper (22); a torch electrode (31); a high-voltage power source circuit (30); a non-bonding detection circuit (40); a first changeover switch (50) switching a connection between the spool (10) and the high-voltage power source circuit (30) or the non-bonding detection circuit (40); and a relay (53) turning on/off a connection between the clamper (22) and a spool side of the first changeover switch (50), and comprises a control part (60) that sets the first changeover switch (50) to the high-voltage power source circuit side and turns off the relay (53) to generate electric discharge, and that sets the first changeover switch (50) to the non-bonding detection circuit side and turns on the relay (53) to perform non-bonding detection. Due to this configuration, electric corro-
(Continued)

sion of a wire clamper can be suppressed and non-bonding detection can be carried out with a simple configuration.

5 Claims, 5 Drawing Sheets

(58) Field of Classification Search
CPC . H01L 2224/85045; H01L 2924/00014; H01L 2224/48091; H01L 2224/48463; H01L 2224/48465; H01L 2224/85181; H01L 24/42
See application file for complete search history.

(56) References Cited

FOREIGN PATENT DOCUMENTS

| | | |
|---|---|---|
| JP | 3041812 | 5/2000 |
| JP | 2000306940 | 11/2000 |

* cited by examiner

WIRE BONDING APPARATUS, CIRCUIT FOR WIRE BONDING APPARATUS, AND METHOD FOR MANUFACTURING SEMICONDUCTOR DEVICE

CROSS-REFERENCE TO RELATED APPLICATION

This application is a 371 application of the international PCT application serial no. PCT/JP2017/012080, filed on Mar. 24, 2017, which claims the priority benefit of Japan application no. 2016-061147, filed on Mar. 25, 2016. The entirety of each of the abovementioned patent applications is hereby incorporated by reference herein and made a part of this specification.

TECHNICAL FIELD

The present invention relates to a wire bonding apparatus, a structure of a circuit for the wire bonding apparatus, and a method of manufacturing a semiconductor device.

BACKGROUND ART

A wire bonding apparatus that connects between electrodes of devices such as semiconductor chips disposed on a circuit board and leads of a circuit board with a metal wire is frequently used. Wire bonding is a method in which a free air ball is formed at a front end of a wire by an electric torch, the free air ball is bonded to an electrode of a device by a capillary, then the capillary is looped, the wire is pressed against a lead of the circuit board by the capillary, and thereafter the wire is pulled up in a state of being gripped by a clamper to cut the wire. The free air ball is formed by clamping the wire with the clamper, applying a high voltage for forming a free air ball to the wire, and generating electrical discharges between the wire and the electric torch to melt the wire. At this time, there are cases in which secondary electrical discharges are generated between the clamper clamping the wire and the wire and this causes electrolytic corrosion on a surface of the clamper. When scratches are made on the surface of the clamper, a force of the clamper acting to grip the wire may be decreased, or a surface of the wire may be damaged by the scratches on the clamper due to the electrolytic corrosion. For this reason, it has been proposed to provide a clamper for electrical connection separately from the clamper for wire cutting (see, for example, Patent Literature 1).

CITATION LIST

Patent Literature

[Patent Literature 1]
Japanese Patent No. 3041812

Technical Problem

However, in a conventional technology of the wire bonding apparatus described in Patent Literature 1, since secondary electrical discharges between a clamper for electrical connection and a wire cannot be inhibited, there is a problem in that electrolytic corrosion occurs on a surface of the clamper for electrical connection and this causes damage on a surface of the wire. Further, when a high voltage for forming a free air ball is not applied to the clamper for electrical connection, there is a problem in that an electrical connection between the wire and a non-bonding detection circuit cannot be secured and detection of non-bonding cannot be performed.

Therefore, it is an objective of the present invention to inhibit electrolytic corrosion of a wire clamper and to perform detection of non-bonding with a simple configuration.

Solution to Problem

A wire bonding apparatus of the present invention includes a spool, a clamper which grips a wire extended from the spool, a torch electrode which forms a free air ball at a front end of the wire by electrical discharges, a high-voltage power supply circuit which supplies power to the torch electrode, a non-bonding detection circuit which performs non-bonding detection between the wire and a device or the wire and a substrate, a first changeover switch which switches a connection between the spool and the high-voltage power supply circuit or the spool and the non-bonding detection circuit, a relay which turns on/off a connection between the clamper and the spool side of the first changeover switch, and a control part which sets the first changeover switch to the high-voltage power supply circuit side and turns off the relay to generate the electrical discharges, and sets the first changeover switch to the non-bonding detection circuit side and turns on the relay to perform the non-bonding detection.

In the wire bonding apparatus of the present invention, it is preferable that the wire bonding apparatus include a second changeover switch disposed between the spool side of the first changeover switch and the spool, and switching a connection between the spool side of the first changeover switch and a grounding wire, in which the control part performs a conduction confirmation of the spool by setting the first changeover switch to the non-bonding detection circuit side, turning on the relay, and setting the second changeover switch to the grounding wire side.

In the wire bonding apparatus of the present invention, it is preferable that the wire bonding apparatus include a wire guide disposed between the spool and the clamper and having a through hole with which at least a portion of the wire is in contact, and a connection wire connecting the wire guide and the spool side of the first changeover switch.

A circuit for a wire bonding apparatus of the present invention includes a high-voltage power supply circuit which supplies power to a torch electrode forming a free air ball at a front end of a wire by electrical discharges, a non-bonding detection circuit which performs non-bonding detection between the wire and a device or the wire and a substrate, a first changeover switch which switches a connection between a spool from which the wire extends and the high-voltage power supply circuit or the spool and the non-bonding detection circuit, a relay which turns on/off a connection between a clamper gripping the wire extended from the spool and the spool side of the first changeover switch, and a control part which sets the first changeover switch to the high-voltage power supply circuit side and turns off the relay to generate the electrical discharges, and sets the first changeover switch to the non-bonding detection circuit side and turns on the relay to perform the non-bonding detection.

A method of manufacturing a semiconductor device of the present invention includes processes as follows: preparing a wire bonding apparatus having a spool, a clamper which grips a wire extended from the spool, a torch electrode which forms a free air ball at a front end of the wire by electrical discharges, a high-voltage power supply circuit which supplies power to the torch electrode, a non-bonding detection circuit which performs non-bonding detection between the wire and a device or the wire and a substrate, a first changeover switch which switches a connection between the spool and the high-voltage power supply circuit or the spool and the non-bonding detection circuit, and a relay which turns on/off a connection between the clamper and the spool side of the first changeover switch; forming the free air ball by setting the first changeover switch to the high-voltage power supply circuit side and turning off the relay, and causing the high-voltage power supply circuit to supply power to the torch electrode; bonding the wire in which the free air ball is formed to a device or a substrate; and performing the non-bonding detection between the wire and the device or the wire and the substrate by setting the first changeover switch to the non-bonding detection circuit side and turning on the relay.

Advantageous Effects of Invention

According to the present invention, it is possible to inhibit electrolytic corrosion of the wire clamper and perform detection of non-bonding with a simple configuration.

DESCRIPTION OF EMBODIMENTS

Figure 1:
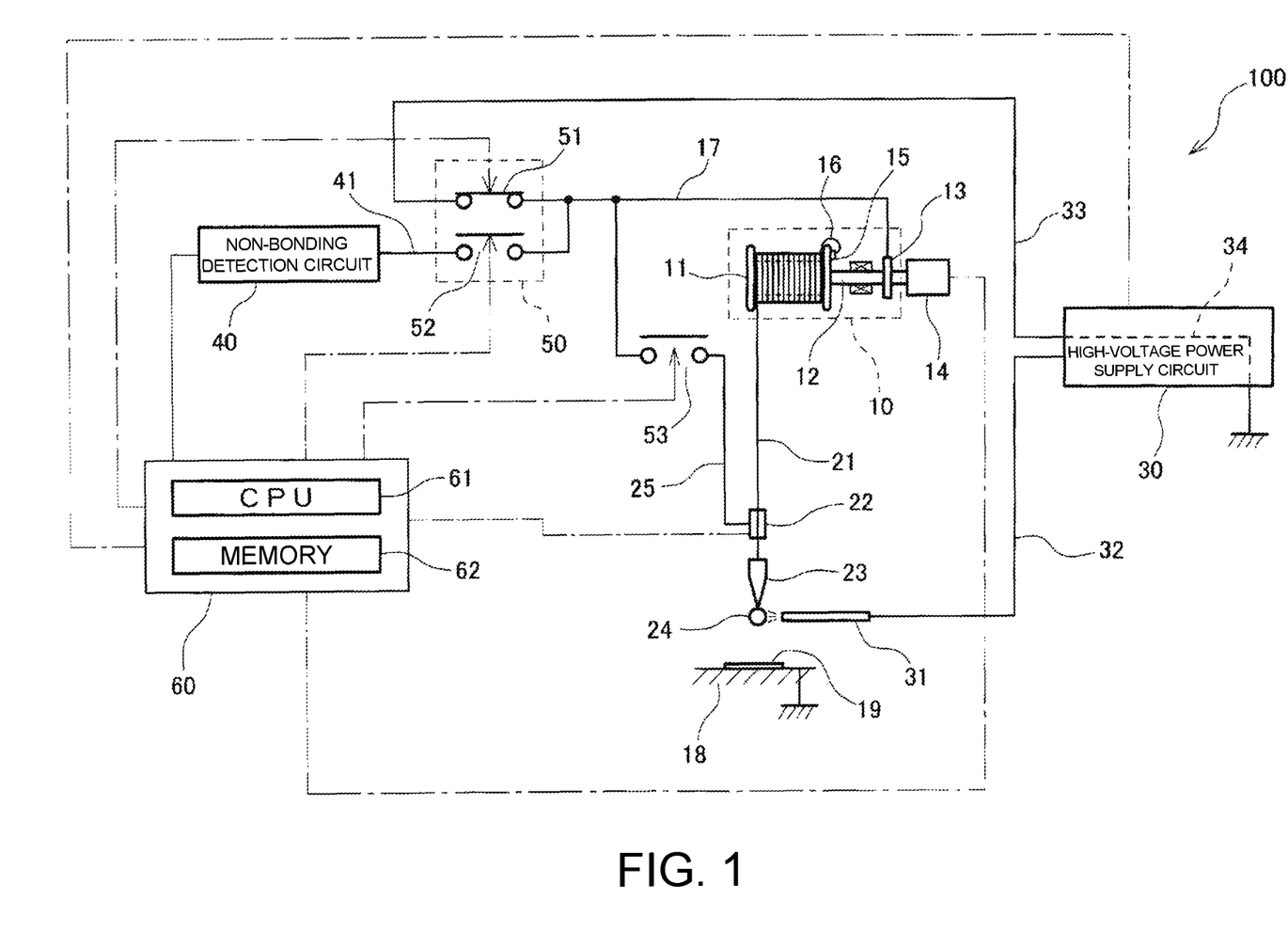
FIG. 1 is a system diagram of a wire bonding apparatus according to an embodiment of the present invention.

Hereinafter, a wire bonding apparatus 100 of the present embodiment will be described with reference to the drawings. As illustrated in FIG. 1, the wire bonding apparatus 100 includes a spool 10, a clamper 22, a torch electrode 31, a high-voltage power supply circuit 30, a non-bonding detection circuit 40, a first changeover switch 50, a relay 53, and a control part 60. In FIG. 1, a dashed-dotted line represents a signal wire. The same applies to other drawings.

The spool 10 includes a main body 11 on which a wire 21 is wound around a cylindrical portion having a flange provided at opposite ends of the cylindrical portion, a rotating shaft 12 connected to the main body 11, a slip ring 13 attached to the rotating shaft 12, and a terminal 15 provided at the flange of the main body 11 and to which an end portion 16 of the wire 21 wound around the cylindrical portion is connected. A motor 14 for rotationally driving the main body 11 is connected to the rotating shaft 12.

The clamper 22 is attached between the spool 10 and a capillary 23. The clamper 22 is opened and closed by an opening/closing drive part (not illustrated) to grip or release the wire 21.

The torch electrode 31 is disposed in the vicinity of the wire 21 extended from a front end of the capillary 23 and generates electrical discharges between the front end of the wire 21 and the torch electrode 31 using power supplied from the high-voltage power supply circuit 30 to form a free air ball 24 at the front end of the wire 21. The torch electrode 31 protrudes to the vicinity of the front end of the wire 21 when the free air ball 24 is formed, and is pulled back to a position away from the front end of the wire 21 in other cases.

The non-bonding detection circuit 40 applies a voltage to the wire 21 and detects that the wire 21 and a device 19 are connected to each other when the applied voltage decreases, and detects that the wire 21 and the device 19 on a substrate 18 connected to the ground are in a non-bonding (poor connection) state when the applied-voltage does not decrease while the voltage is applied to the wire 21.

The first changeover switch 50 is configured with two relays including a high-voltage power supply circuit side relay 51 and a non-bonding detection circuit side relay 52. When one of the two relays is turned on and the other thereof is turned off, a connection between the spool 10 and the high-voltage power supply circuit 30 or the spool 10 and the non-bonding detection circuit 40 is switched.

A plus side terminal of the high-voltage power supply circuit 30 is connected to the torch electrode 31 by a connection wire 32. Also, a ground side terminal of the high-voltage power supply circuit 30 connected to the ground by an internal wiring 34 is connected to one end of the high-voltage power supply circuit side relay 51 by a connection wire 33. The other end of the high-voltage power supply circuit side relay 51 is connected to the slip ring 13 of the spool 10 by a connection wire 17. A terminal of the non-bonding detection circuit 40 is connected to one end of the non-bonding detection circuit side relay 52 by a connection wire 41. The other end of the non-bonding detection circuit side relay 52 is connected to the connection wire 17. The connection wire 17 and the clamper 22 are connected by a connection wire 25, and are connected and released by the relay 53.

The high-voltage power supply circuit 30, the non-bonding detection circuit 40, the clamper 22, the high-voltage power supply circuit side relay 51 and the non-bonding detection circuit side relay 52 of the first changeover switch 50, the relay 53, and the motor 14 are connected to the control part 60, and is configured to operate according to a command from the control part 60. The control part 60 is a computer in which a central processing part (CPU) 61 for performing information processing or calculation and a memory 62 for storing control programs or control data are provided.

Further, the high-voltage power supply circuit 30, the non-bonding detection circuit 40, the first changeover switch 50, the relay 53, and the control part 60 constitute a circuit for a wire bonding apparatus (not illustrated).

Figure 2:
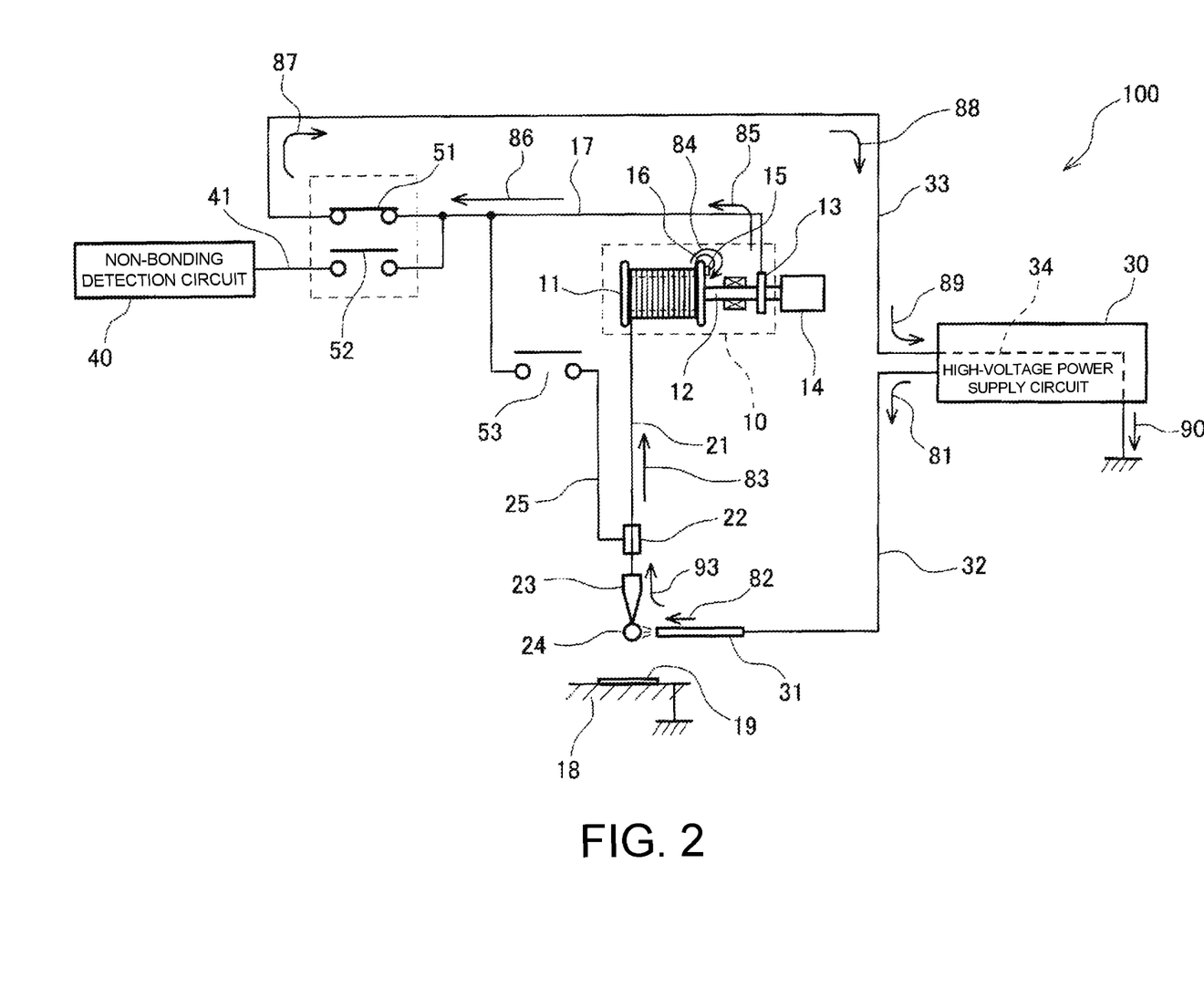
FIG. 2 is an explanatory view illustrating a flow of a current when a free air ball is formed in the wire bonding apparatus illustrated in FIG. 1.

Next, an operation of forming the free air ball 24 in the wire bonding apparatus 100 will be described with reference to FIG. 2. As illustrated in FIG. 2, the control part 60 turns on the high-voltage power supply circuit side relay 51 of the first changeover switch 50 and turns off the non-bonding detection circuit side relay 52. Further, the control part 60 turns off the relay 53 to close the clamper 22. Then, the control part 60 extends the torch electrode 31 to the vicinity of the front end of the wire 21 that has been extended from the front end of the capillary 23, and a high voltage is applied from the high-voltage power supply circuit 30 to the torch electrode 31 as illustrated by arrows 81 and 82 in FIG. 2.

Electrical discharges are generated between the torch electrode 31 and the front end of the wire 21 by the applied high voltage, and the free air ball 24 is formed at the front end of the wire 21. Further, a current flowing between the torch electrode 31 and the wire 21 due to the electrical discharges flows from the end portion 16 of the wire 21 wound around the main body 11 of the spool 10 to the terminal 15 as illustrated by arrows 83 and 84 in FIG. 2, and reaches the slip ring 13 through the rotating shaft 12 from the flange portion of the main body 11 as illustrated by an arrow 85 in FIG. 2. Then, the current flows from the slip ring 13 through the connection wire 17 and the high-voltage power supply circuit side relay 51 as illustrated by arrows 85 and 86 in FIG. 2, flows to the ground side terminal of the high-voltage power supply circuit 30 through the connection wire 33 as illustrated by arrows 87 to 89 in FIG. 2, and flows to the ground through the internal wiring 34 as illustrated by an arrow 90.

Therefore, in the wire bonding apparatus 100, no current flows between the clamper 22 and the wire 21 when the free air ball 24 is formed, and secondary electrical discharges between the clamper 22 and the wire 21 are not generated. Therefore, in the wire bonding apparatus 100, occurrence of electrolytic corrosion of the clamper 22 can be inhibited.

Next, an operation of detecting non-bonding between the wire 21 and an electrode of the device 19 after bonding in the wire bonding apparatus 100 will be described with reference to FIG. 3. When the capillary 23 is lowered and the free air ball 24 is bonded to the electrode of the device 19 to form a crimped ball 24a, it is in an open state as illustrated by a broken line in FIG. 3. Immediately after the bonding to the device 19, the control part 60 turns off the high-voltage power supply circuit side relay 51 and turns on the non-bonding detection circuit side relay 52 in the first changeover switch 50. Also, the control part 60 turns on the relay 53. Then, the control part 60 applies a detection voltage from the non-bonding detection circuit 40 to the connection wire 41. When the detection voltage is applied, a current flows from the non-bonding detection circuit side relay 52 to the slip ring 13 through the connection wire 17 as illustrated by arrows 71 to 73 in FIG. 3, passes from the slip ring 13 through the rotating shaft 12 and the terminal 15, and flows from the end portion 16 of the wire 21 to the wire 21 wound around the main body 11 of the spool 10 as illustrated by an arrow 74 in FIG. 3. Then, the current passes through a straight portion of the wire 21 as illustrated by arrows 75 and 76, and passes through the wire 21 that has extended from the front end of the capillary 23 to flow to the crimped ball 24a that is bonded to the electrode of the device 19 as illustrated by an arrow 77. Then, the current flows from the electrode of the device 19 to the ground.

When the wire 21 and the electrode of the device 19 are electrically connected, a current flows from the non-bonding detection circuit 40 to the ground with the route as described above, and the voltage applied from the non-bonding detection circuit 40 to the connection wire 41 is decreased. Then, the control part 60 determines that the wire 21 and the device 19 are satisfactorily connected when the voltage of the connection wire 41 is decreased, and, on the other hand, the control part 60 determines that the wire 21 and the device 19 have poor connection and non-bonding has occurred therebetween, and outputs a non-bonding detection signal when the applied voltage is not decreased.

Figure 3:
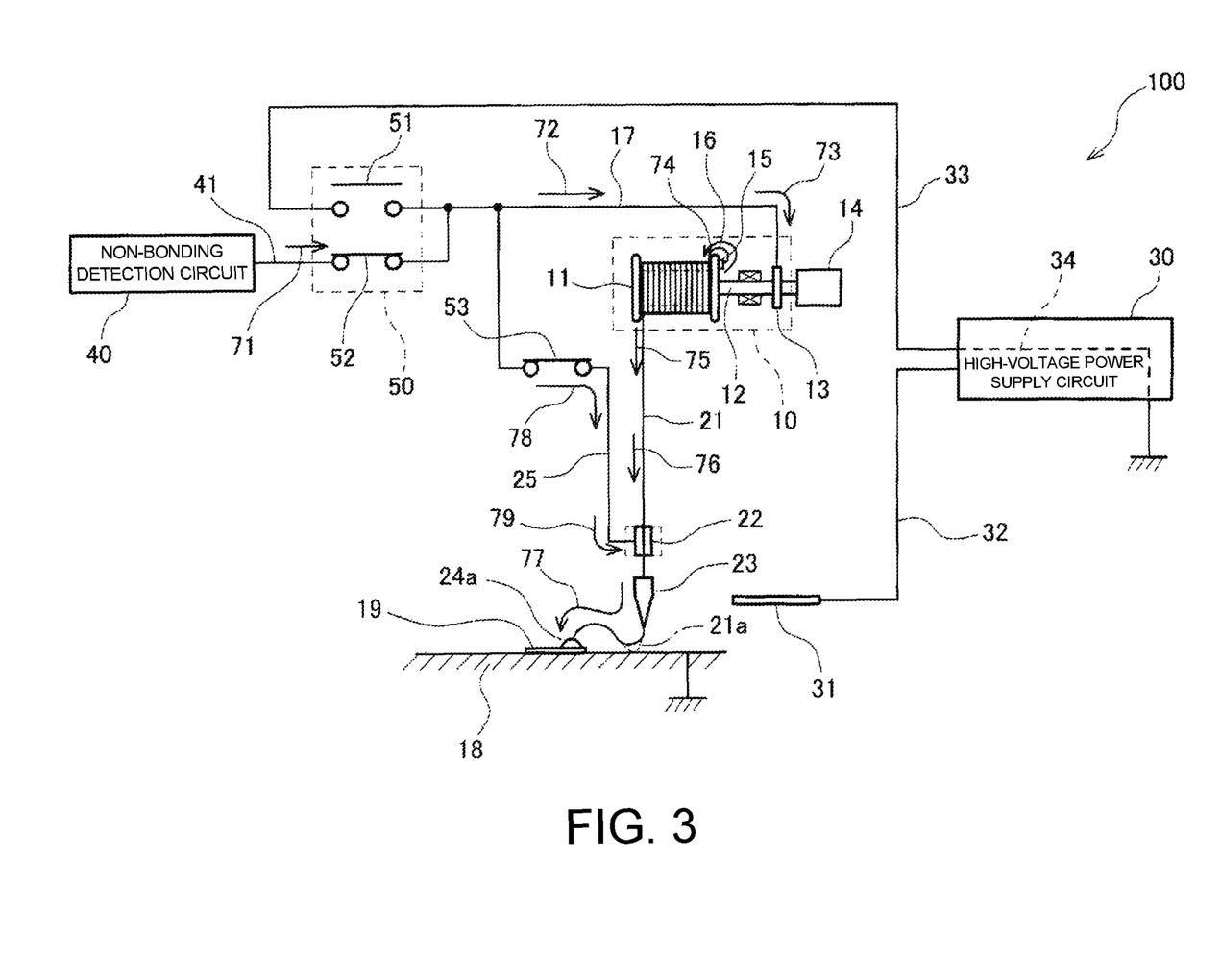
FIG. 3 is an explanatory view illustrating a flow of a current when non-bonding is detected in the wire bonding apparatus illustrated in FIG. 1.

Also, after the wire 21 is bonded to the substrate 18 after the crimped ball is formed, it is a state in which a tail wire 21a illustrated by a dashed-dotted line in FIG. 3 extends between the substrate 18 and the capillary 23. The control part 60 closes the clamper 22 and pulls up the wire 21 to cut the tail wire 21a from the substrate 18. Immediately before the cutting operation, the control part 60 applies the voltage from the non-bonding detection circuit 40 to the connection wire 41 to perform non-bonding detection between the substrate 18 and the wire 21, as described above. In this state, since the clamper 22 has been closed, in addition to the route described above, a current flows also from the connection wire 17 to the clamper 22 through the relay 53 and the connection wire 25, and thus the current flows to the wire 21 also from the clamper 22 as illustrated by arrows 78 and 79 in FIG. 3. As described above, the control part 60 determines that the wire 21 and the substrate 18 are satisfactorily connected when the voltage of the connection wire 41 is decreased, and, on the other hand, the control part 60 determines that the wire 21 and the substrate 18 have poor connection and non-bonding has occurred therebetween, and outputs a non-bonding detection signal when the applied voltage is not decreased.

As described above, in the wire bonding apparatus 100 of the present embodiment, since the free air ball 24 is formed by setting the first changeover switch 50 to the high-voltage power supply circuit side and turning off the relay 53, and the non-bonding detection is performed by setting the first changeover switch 50 to the non-bonding detection circuit side and turning on the relay 53, electrolytic corrosion of the clamper 22 is inhibited by preventing secondary electrical discharges between the clamper 22 and the wire 21 from being generated when the free air ball 24 is formed and the non-bonding detection between the wire 21 and the device 19 or the wire 21 and the substrate 18 can be performed. Further, according to the process as described above, the wire 21 is bonded to the device 19 on the substrate 18 or the substrate 18 while inhibiting electrolytic corrosion of the clamper 22 and performing the non-bonding detection between the wire 21 and the device 19 or the wire 21 and the substrate 18, and thus a semiconductor device in which the device 19 and the substrate 18 are connected with the wire 21 can be manufactured.

Figure 4:
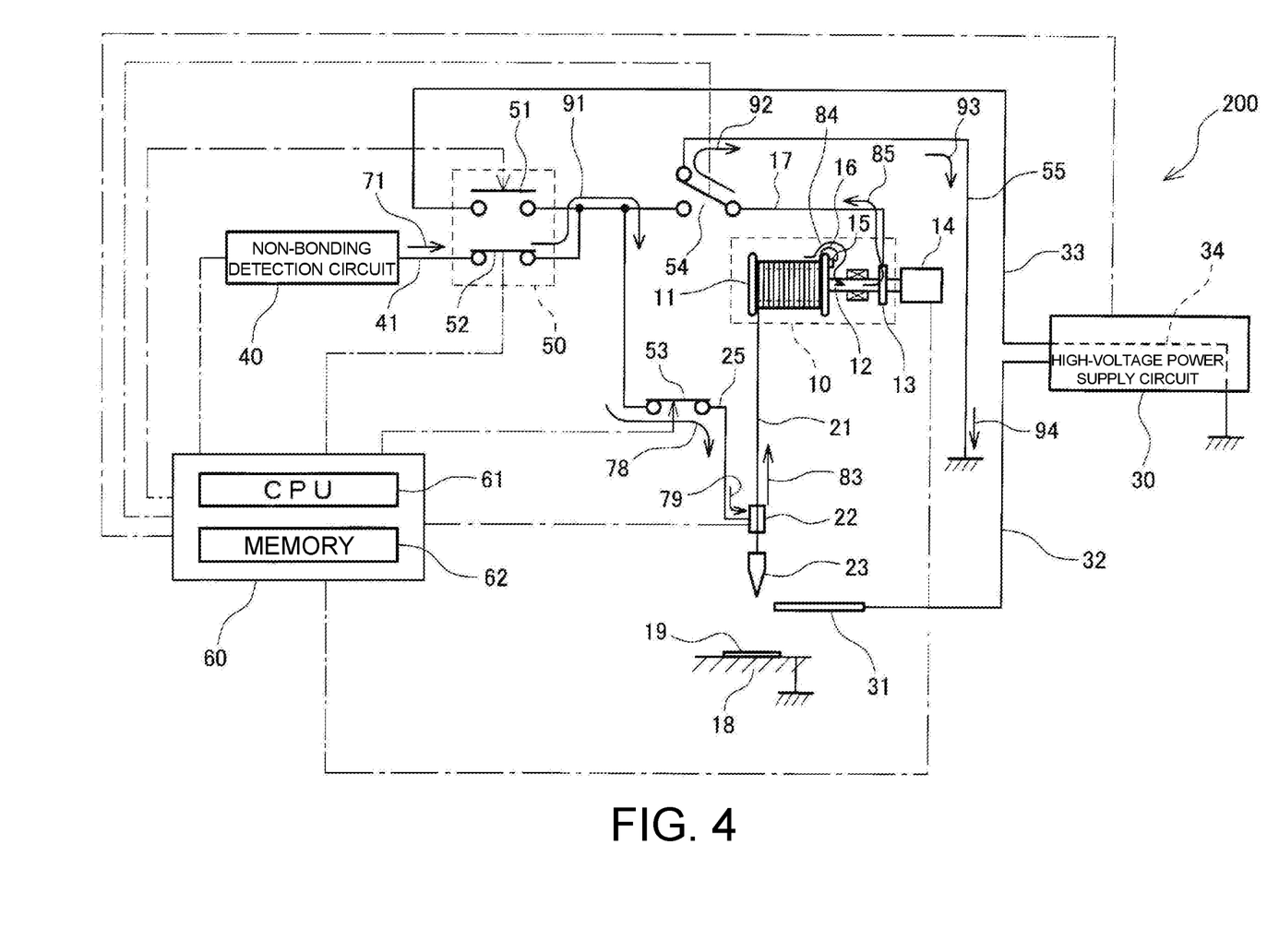
FIG. 4 is a system diagram of a wire bonding apparatus according to another embodiment of the present invention.

Next, a wire bonding apparatus 200 according to another embodiment of the present invention will be described with reference to FIG. 4. Portions the same as those in the wire bonding apparatus 100 described above with reference to FIGS. 1 to 3 are denoted by the same reference signs and description thereof will be omitted.

When the non-bonding detection between the device 19 and the wire is performed in the wire bonding apparatus 100 described above, a current passes through the spool 10 and flows from the wire 21 and the crimped ball 24a to the ground due to a detection voltage applied from the non-bonding detection circuit 40 to the connection wire 41. At this time, when electrical conduction of the slip ring 13 of the spool 10 is poor, the applied voltage is not decreased, and there is a likelihood of erroneous detection of non-bonding despite the fact that the wire 21 and the device 19 are connected. Therefore, as illustrated in FIG. 4, the wire bonding apparatus 200 of the present embodiment includes a second changeover switch 54 for switching the connection between the spool side of the first changeover switch 50 and a grounding wire 55 in the connection wire 17 of the wire bonding apparatus 100 described with reference to FIGS. 1 to 3 so that a conduction confirmation of the slip ring 13 of the spool 10 can be performed. As illustrated in FIG. 4, the second changeover switch 54 is connected to a control part 60 and operates according to a command from the control part 60. Thereby, the wire bonding apparatus 200 can distinguish between whether the cause of the applied voltage not decreasing is due to the non-bonding or poor electrical conduction of a slip ring 13, and thereby erroneous detection of non-bonding can be inhibited and more reliable non-bonding detection can be performed.

An operation of performing a conduction confirmation of the slip ring 13 by the wire bonding apparatus 200 will be described with reference to FIG. 4. The control part 60 switches the second changeover switch 54 to the grounding wire 55 side to cause a connection wire 17 and the grounding wire 55 to have electrical conduction and to cut off electrical conduction between the connection wire 17 and a spool side of a high-voltage power supply circuit side relay 51. Further, the control part 60 turns on a relay 53 and closes a clamper 22.

The control part 60 applies a detection voltage from a non-bonding detection circuit 40 to a connection wire 41 similarly to the non-bonding detection operation described above. When the detection voltage is applied, a current flows from a non-bonding detection circuit side relay 52 to the clamper 22 through the connection wire 17 and the relay 53 as illustrated by arrows 71, 91, 78, and 79 in FIG. 4. Then, the current flows from the clamper 22 to a wire 21 and from an end portion 16 of the wire 21 wound around a main body 11 of a spool 10 to a terminal 15 as illustrated by arrow 83 and 84 in FIG. 4, flows from the flange portion of the main body 11 through a rotating shaft 12 and from the slip ring 13 to the connection wire 17 as illustrated by an arrow 85 in FIG. 4, flows to the grounding wire 55 through the second changeover switch 54 as illustrated by an arrow 92, and flows to the grounding wire 55 as illustrated by arrow 93 and 94. When the slip ring 13 has electrical conduction similarly to the non-bonding detection described above, the current flows from the non-bonding detection circuit 40 to the ground with the route as described above, and the voltage applied from the non-bonding detection circuit 40 to the connection wire 41 is decreased. Then, when the voltage of the connection wire 41 is decreased, the control part 60 determines that electrical conduction of the slip ring 13 is normal. On the other hand, when the applied voltage is not decreased, it is determined that the electrical conduction of the slip ring 13 is poor, and a signal of poor electrical conduction of the slip ring 13 is output.

As described above, the wire bonding apparatus 200 of the present embodiment can determine whether the cause of the applied voltage not decreasing is due to the non-bonding or poor electrical conduction of the slip ring 13 in addition to obtaining the same effects as in the wire bonding apparatus 100 described above, and thereby erroneous detection of non-bonding can be inhibited and more reliable non-bonding detection can be performed.

Figure 5:
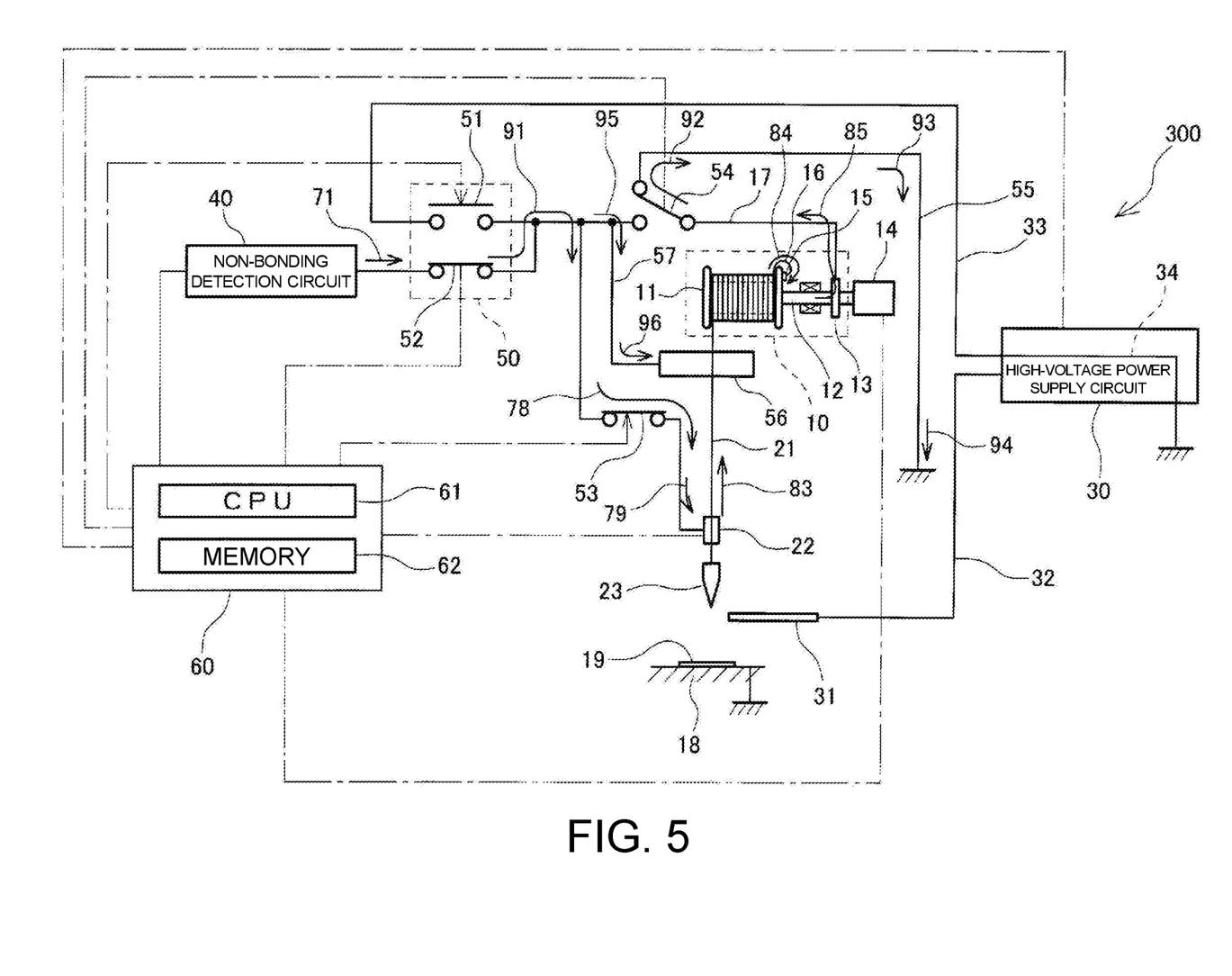
FIG. 5 is a system diagram of a wire bonding apparatus according to another embodiment of the present invention.

Next, a wire bonding apparatus 300 according to another embodiment will be described with reference to FIG. 5. Portions the same as those in the wire bonding apparatus 100 and the wire bonding apparatus 200 described above with reference to FIGS. 1 to 4 are denoted by the same reference signs and description thereof will be omitted. In the wire bonding apparatus 300, a wire guide 56 and a connection wire 57 are added to the wire bonding apparatus 200 described above with reference to FIG. 4.

The wire guide 56 is disposed between a spool 10 and a clamper 22 and has a through hole with which at least a portion of a wire 21 is in contact. The wire guide 56 is made of a metal. The wire guide 56 may be a blow-up portion that applies an upward tension to the wire 21 by blowing air to the through hole from a lower side thereof. The wire guide 56 is connected to the spool side of a first changeover switch 50 by the connection wire 57.

A conduction confirmation of the slip ring 13 in the wire bonding apparatus 300 will be described. A current from a non-bonding detection circuit 40 flows from the spool side of the first changeover switch 50 to the wire guide 56 through a connection wire 17 as illustrated by arrows 95 and 96 in FIG. 5. Since the wire guide 56 is in contact with the wire 21, the current flows from the wire guide 56 to the wire 21 and flows from the spool 10 to the ground through a grounding wire 55 as described above with reference to FIG. 4. Therefore, the wire bonding apparatus 300 can perform the conduction confirmation of the slip ring 13 even when the clamper 22 is in an open state.

As described above, since the wire bonding apparatus 300 of the present embodiment can perform a conduction confirmation of the slip ring 13 more reliably than that in the wire bonding apparatus 200 described above, erroneous detection of non-bonding can be more reliably inhibited, and thus more reliable non-bonding detection can be performed.

The invention claimed is:

1. A wire bonding apparatus comprising:
   a spool;
   a clamper that grips a wire extended from the spool;
   a torch electrode that forms a free air ball at a front end of the wire by electrical discharges;
   a high-voltage power supply circuit that supplies power to the torch electrode;
   a non-bonding detection circuit that performs non-bonding detection between the wire and a device or the wire and a substrate;
   a first changeover switch that switches a connection between the spool and the high-voltage power supply circuit or the spool and the non-bonding detection circuit;
   a relay that turns on/off a connection between the clamper and the spool side of the first changeover switch; and
   a control part that sets the first changeover switch to the high-voltage power supply circuit side and turns off the relay to generate the electrical discharges, and sets the first changeover switch to the non-bonding detection circuit side and turns on the relay to perform the non-bonding detection.

2. The wire bonding apparatus according to claim 1, comprising:
   a second changeover switch disposed between the spool side of the first changeover switch and the spool, and switching a connection between the spool side of the first changeover switch and a grounding wire, wherein
   the control part performs a conduction confirmation of the spool by setting the first changeover switch to the non-bonding detection circuit side, turning on the relay, and setting the second changeover switch to the grounding wire side.

3. The wire bonding apparatus according to claim 2, comprising:
   a wire guide disposed between the spool and the clamper and including a through hole with which at least a portion of the wire is in contact; and
   a connection wire connecting the wire guide and the spool side of the first changeover switch.

4. A circuit for a wire bonding apparatus comprising:
   a high-voltage power supply circuit that supplies power to a torch electrode forming a free air ball at a front end of a wire by electrical discharges;
   a non-bonding detection circuit that performs non-bonding detection between the wire and a device or the wire and a substrate;
   a first changeover switch that switches a connection between a spool from which the wire extends and the high-voltage power supply circuit or the spool and the non-bonding detection circuit;

a relay that turns on/off a connection between a clamper gripping the wire extended from the spool and the spool side of the first changeover switch; and a control part that sets the first changeover switch to the high-voltage power supply circuit side and turns off the relay to generate the electrical discharges, and sets the first changeover switch to the non-bonding detection circuit side and turns on the relay to perform the non-bonding detection.

5. A method of manufacturing a semiconductor device comprising processes as follows:

preparing a wire bonding apparatus including: a spool; a clamper that grips a wire extended from the spool; a torch electrode that forms a free air ball at a front end of the wire by electrical discharges; a high-voltage power supply circuit that supplies power to the torch electrode; a non-bonding detection circuit that performs non-bonding detection between the wire and a device or the wire and a substrate; a first changeover switch that switches a connection between the spool and the high-voltage power supply circuit or the spool and the non-bonding detection circuit; and a relay that turns on/off a connection between the clamper and the spool side of the first changeover switch;

forming the free air ball by setting the first changeover switch to the high-voltage power supply circuit side and turning off the relay, and causing the high-voltage power supply circuit to supply power to the torch electrode;

bonding the wire in which the free air ball is formed to a device or a substrate; and performing the non-bonding detection between the wire and the device or the wire and the substrate by setting the first changeover switch to the non-bonding detection circuit side and turning on the relay.

* * * * *